United States Patent [19]
Dyson et al.

[11] Patent Number: 5,779,428
[45] Date of Patent: Jul. 14, 1998

[54] CARRIER CART

[75] Inventors: Paul C. Dyson, Raleigh; Danny B. Merritt, Durham, both of N.C.

[73] Assignee: Mitsubishi Semiconductor America, Inc., Durham, N.C.

[21] Appl. No.: 783,800

[22] Filed: Jan. 15, 1997

[51] Int. Cl.[6] ............................................. B62B 3/00
[52] U.S. Cl. ........................ 414/536; 414/401; 193/35 A
[58] Field of Search ............................. 414/529, 530, 414/531, 532, 533, 534, 535, 536, 401, 396, 584; 193/35 R, 35 A; 269/298, 301, 316, 317, 17; 244/137.1; 410/69

[56] References Cited

U.S. PATENT DOCUMENTS

| | | | |
|---|---|---|---|
| 3,233,761 | 2/1966 | McCartney et al. | 414/536 |
| 3,279,631 | 10/1966 | McCartney . | |
| 3,429,403 | 2/1969 | Drechsler et al. | 414/536 X |
| 3,435,969 | 4/1969 | McCartney et al. | 414/536 |
| 3,679,075 | 7/1972 | Guyaux et al. | 414/536 X |
| 3,869,052 | 3/1975 | Leahy | 414/401 |
| 3,884,374 | 5/1975 | Swallow, Jr. | 414/536 |
| 4,020,959 | 5/1977 | Livesay | 193/35 A X |
| 4,541,768 | 9/1985 | Walker et al. . | |
| 4,664,582 | 5/1987 | Edmeads | 414/401 |
| 4,765,493 | 8/1988 | Kinney . | |
| 4,852,712 | 8/1989 | Best . | |
| 5,037,265 | 8/1991 | O'Brien . | |
| 5,147,025 | 9/1992 | Flippo . | |
| 5,360,307 | 11/1994 | Schemm et al. | 414/401 X |

FOREIGN PATENT DOCUMENTS

| | | | |
|---|---|---|---|
| 319163 | 12/1993 | Japan | 414/536 |

*Primary Examiner*—Frank E. Werner
*Attorney, Agent, or Firm*—McDermott, Will & Emery

[57] ABSTRACT

A cart includes at least one bed of rollers for receiving, supporting and discharging a workpiece such as a burn-in board for semiconductor component testing. The cart includes a locking mechanism which does not need manipulation by an operator to positively lock the workpiece in place once put on the roller bed. Positive manipulation of the locking mechanism is then required for workpiece discharge and maximum operator safety.

20 Claims, 2 Drawing Sheets

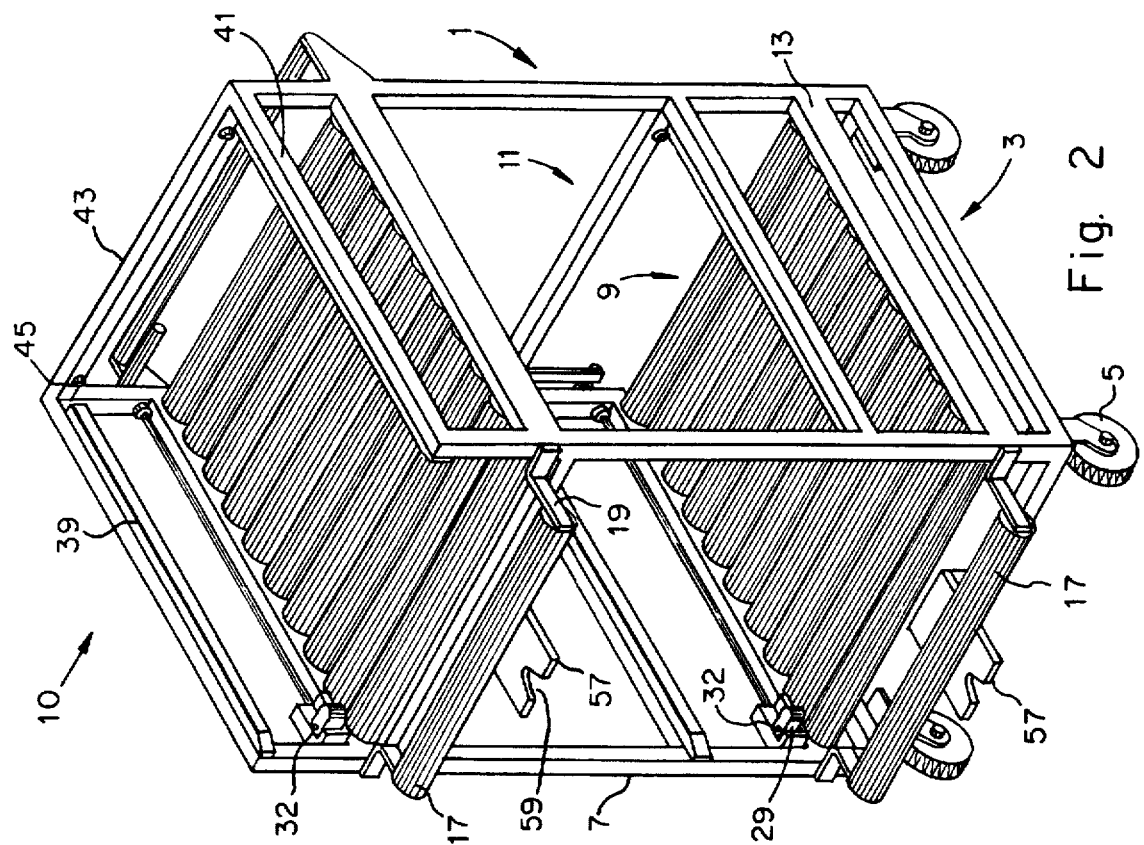
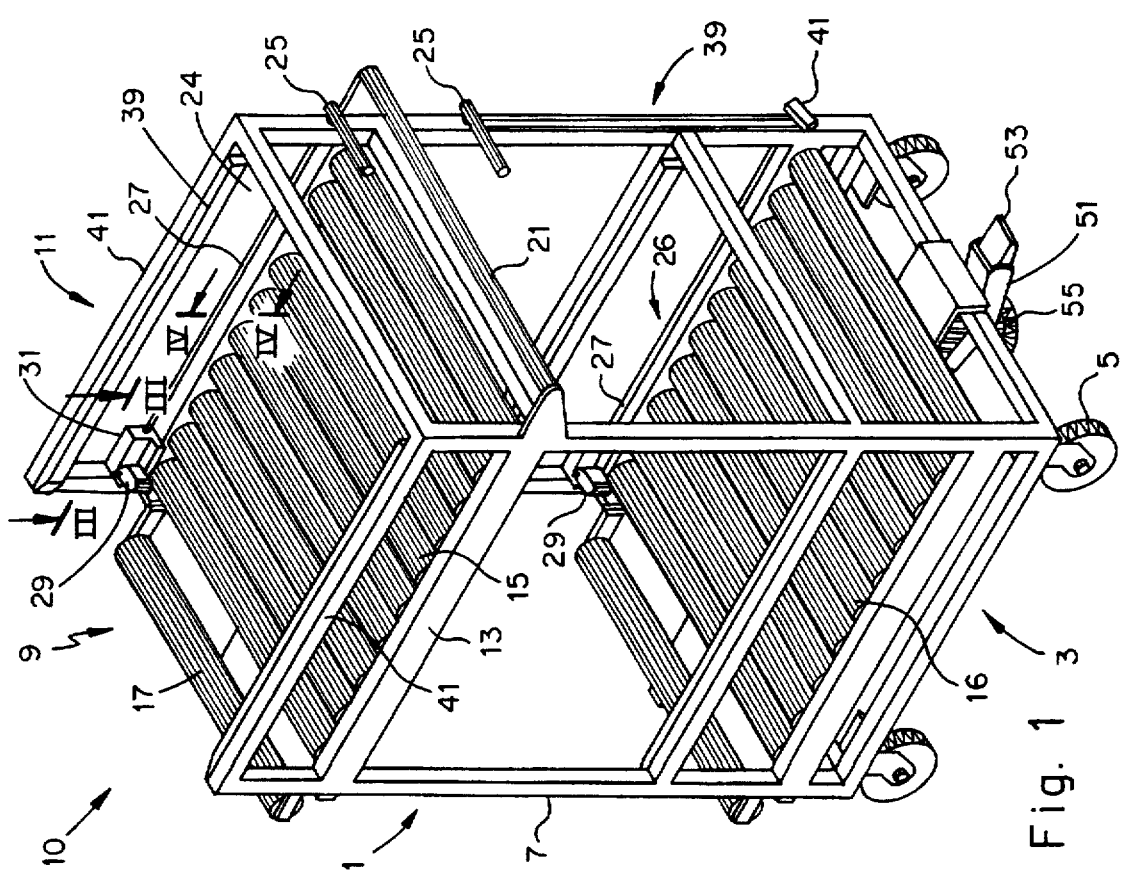

CARRIER CART

FIELD OF THE INVENTION

The present invention is directed to a carrier cart and, in particular, to a carrier cart which is especially adapted for transporting burn-in boards between various stations.

BACKGROUND ART

In the processing of semiconductor components, it is common place to test these components for premature failure. One method of testing employs a burn-in board which is adapted to receive a particular semiconductor components and support it during testing. Typically, the semiconductor component or components are attached to the board using an inserting device, e.g. an inserter, and then placed in an oven to subject the component to a high temperature environment to test for premature component failure. The burn-in boards used in this test work are very heavy and pose a risk to an operator handling the board during semiconductor component insertion and removal and oven charging/discharging. The burn-in board may often weigh as much as 150 lbs. and must be able to be safely transported between the various stations used for testing purposes.

Prior art carriers presently use a spring loaded locking mechanism which must be raised to allow loading of the burn-in board and lowered to lock the burn-in board in place of the carrier cart. These prior art mechanisms require an operator to be wary of not only charging the heavy burn-in board to the cart but also requires the operator's attention to operate the mechanism to allow burn-in board charging.

In view of the disadvantages of prior art carrier carts noted above, a need has developed to provide an improved carrier cart which is both safer and easier to use for an operator. The present invention solves this need by providing a unique carrier cart which allows charging of a burn-in board to the cart without the need for operator manipulation of a locking mechanism. The inventive carrier cart includes other safety features which facilitates the transport of the burn-in board without a safety risk to an operator of the carrier cart.

SUMMARY OF THE INVENTION

Accordingly, it is a first object of the present invention to provide an improved carrier cart for transporting a workpiece such as a burn-in board.

Another object of the present invention is to provide a carrier cart which utilizes a unique locking mechanism which does not require operator manipulation during burn-in board or workpiece charging.

A still further object of the present invention is to provide a carrier cart which includes guides to facilitate linking of the cart with an apparatus which is to either receive or discharge a workpiece such as a burn-in board.

Yet another object of the present invention is to provide a carrier cart which includes a locking mechanism which is easily accessible by a cart operator and only requires manipulation to discharge a workpiece loaded on the cart.

Other objects and advantages of the present invention will be apparent as a description thereof proceeds.

In satisfaction of the foregoing objects and advantages, the inventive carrier cart comprises a frame having a wheeled base and at least one carrier assembly supported by the frame, the carrier assembly including a bed of rollers for receiving, supporting and discharging a workpiece.

The cart includes a locking mechanism which has locking tab and a stop, each positioned in a travel path above the bed of rollers. The locking tab is movable about two axes, movement about the first axis for receiving a workpiece onto the bed of rollers and locking a workpiece between the stop and the locking tab. Movement about the second axis allows for discharging of the workpiece from the bed of rollers.

The cart frame can also include an entry/exit roller aligned with the bed of rollers to facilitate receiving and discharging of the workpiece. The cart frame can also include guides positioned above the bed of rollers for guiding the workpiece during receiving and discharging operations.

The locking method, preferably, further comprises a rod which is supported by the frame and positioned adjacent a bed of rollers. One end of the rod is operatively connected to a handle. The rod also supports a holder for the locking tab, the locking tab pivotally mounted to the holder for movement about the first axis. Rotative movement of the rod moves the locking tab and holder about the second axis which corresponds to the rod axis.

In loading a workpiece onto the cart, the workpiece is slid over the entry/exit roller, the forward end of the workpiece contacting the locking tab. Since the locking tab is mounted for pivotable movement, i.e., about the axis of a pivot pin on the tab holder, the locking tab pivots out of the way as a result of the forward movement of the workpiece onto the bed of rollers. Once the workpiece is completely on the bed of rollers, the locking tab pivots back to its rest position to securely lock the workpiece in place. During unloading, rotation of the rod via the handle pivots the locking tab holder about the rod axis from a locking position to an unlocking position. The workpiece can then be rolled off the bed of rollers to a desired location.

The cart also includes a push bar for ease of manipulation and a centering tab configured to align the cart with a station for either receiving or discharging the workpiece.

The cart can also include a foot brake which locks the cart in a given location.

Two or more beds of rollers can be provided to carry a plurality of workpieces. When using at least two beds of rollers, the beds are positioned one on top of the other with a separate entry/exit roller, a centering tab, a locking mechanism and guides for each bed of rollers.

BRIEF DESCRIPTION OF DRAWINGS

References is now made to the drawings of the invention wherein:

FIGS. 1 and 2 are front and back perspective views of a preferred embodiment of the inventive carrier cart;

DESCRIPTION OF THE PREFERRED EMBODIMENTS

Figure 3:
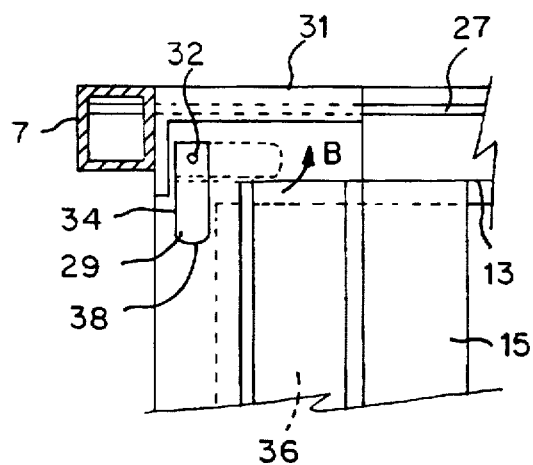
FIG. 3 is a view along the line III-line III shown in FIG. 1 with motion of locking tab shown.

With reference now to FIGS. 1 and 2, the inventive carrier cart is generally designated by the reference numeral 10 and is seen to include a tubular frame 1 having a base 3 and freely rotatable wheels 5 mounted to the base 3.

The frame 1 has four upstanding legs 7, the legs 7 providing support for a pair of carrier assemblies 9. Provided with each carrier assembly 9 is a guide 11 which facilitates receiving and discharging of a workpiece onto a respective carrier assembly.

Each carrier assembly 9 includes frame members 13 which support a bed of rollers. For description purposes, the bed of rollers on the upper carrier assembly is designated by the reference numeral 15 and the bed of rollers on the lower carrier assembly is designated by the reference numeral 16. The rollers are freely rotatable about the frame members 13 and are preferably two inches in diameter. Each bed of rollers forms a support to hold a workpiece on the carrier cart.

The carrier cart also includes an entry/exit roller 17 which is secured to the frame via flanges 19. The entry/exit roller 17 facilitates charging and discharging of a workpiece onto a particular bed of rollers.

The beds of rollers 15 and 16 are located on the upstanding legs 7 at a specified height from the floor upon which the cart rests. Although the height of each bed of rollers can vary, it is preferred that the bed roller height correspond to the height of an apparatus which will either discharge or receive a workpiece. For example, when using burn-in boards as the workpiece, the roller board heights can be set to align with the entry/exit of a burn-in oven or inserter. In this matter, the burn-in boards are easily charged or discharged to one of these apparatus.

Still referring to FIGS. 1 and 2, the cart also includes a push bar 21 attached to the frame 1 adjacent the upper bed of rollers 15. The push bar 21 facilitates pushing or pulling the cart for transport of a given workpiece.

Each of the carrier assemblies 9 include a locking mechanism to retain a workpiece on a bed of rollers when received and to permit discharge of the workpiece when desired by a cart operator. The locking mechanism associated with the upper bed of rollers 15 is generally designated by the reference numeral 24 with the locking mechanism associated with the lower bed of rollers 16 identified by the reference numeral 26. Each of the locking mechanisms 24 and 26 include a handle 25, rod 27 and locking tab 29. The locking tab 29 is pivotally mounted to a locking tab holder 31 via pin 32. The rod 27 is mounted to the upstanding legs 7 for rotation about the rod axis. One end of the rod 27 has the handle 25 attached thereto with the other rod end secured in the upstanding frame leg 7. The rod is affixed to the locking tab holder 31 for pivoting movement as described hereinafter.

Figure 4:
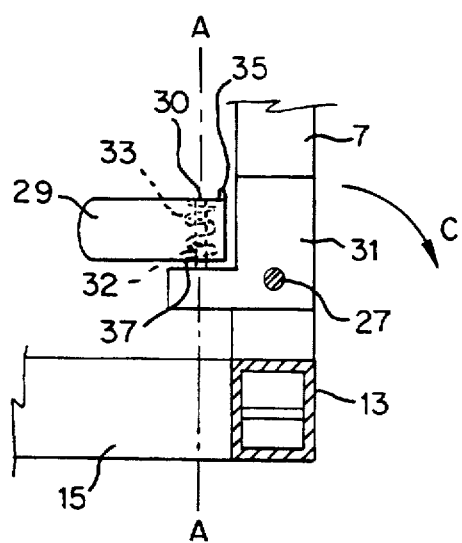
FIGS. 4 and 5 are view along the line IV—IV in FIG. 1 showing rotative movement of the locking tab holder.
Figure 5:
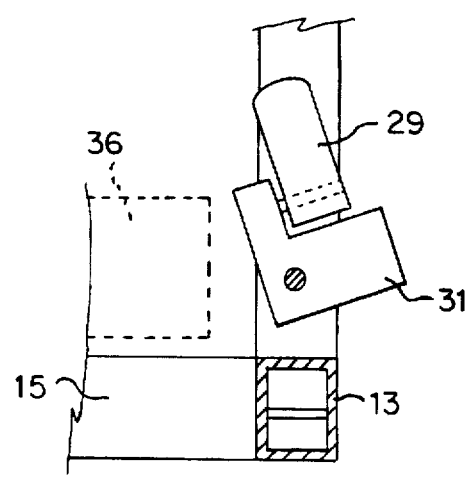

Referring now to FIG. 4, the locking tab 29 is pivotally mounted to the locking tab holder 31 at pin 32. The pivotable mounting 30 allows for the locking tab 29 to pivot about the axis identified by "A". The pivoting movement is controlled by the spring 33 which surrounds pin 32 and is attached at end 35 to the tab 29 and at the end 37 to the locking tab holder 31.

The spring is configured to bias the locking tab 29 in the locking position depicted in FIGS. 1, 2 and 3. In other words, when no force is applied to the locking tab surface 34, the spring 33 biases the tab 29 to the locked position.

The locking tab 29 functions to hold a workpiece which has been rolled onto a respective bed of rollers until the unlocking operation to be described below is made.

In order to support a workpiece on a bed of rollers, a workpiece, e.g. a burn-in board, is slid over entry/exit roller 17 so that a front end comes in contact with the face 34 of the locking tab 29. Continued movement of the workpiece onto the bed of rollers pivots the locking tab 29 about axis A and in direction B as shown in FIG. 3. The workpiece generally designated by reference numeral 36 in FIG. 3 can then be slid onto the bed of rollers 15. Once the workpiece 36 passes the end 38 of locking tab 29, the spring bias pivots the tab 29 back to the locked position so that the workpiece 36 cannot slide off the bed of rollers 15.

Referring now to FIGS. 1, 2, 4 and 5, to discharge a workpiece from the bed of rollers 15, a cart operator grasps the handle 25 and rotates it clockwise. Handle rotation rotates the rod 27 on its axis. Since the locking tab holder 31 is fixably mounted to the rod 27, the locking tab holder 31 pivots about the rod axis, i.e., in direction C from the position in FIG. 4 from the position shown in FIG. 5. In other words, rotation of the rod 27 pivots the locking tab holder and locking tab 29 out of a travel path of the workpiece 36 so that it can be slid off the bed of rollers 15. Counterclockwise movement of the handle 25 then rotates the locking tab holder 31 back in the position shown in FIG. 4 so that another workpiece can be received by the bed of rollers 15. It should be understood that the counterclockwise rotation of the rod 27 can be effected by gravity wherein the holder 31 and tab 29 are balanced so that once the handle 25 is released by an operator, gravity will rotate the holder 31 backed to the locked position as shown in FIG. 4. Alternatively, the counterclockwise movement can be achieved by a positive manipulation by an operator or a biasing mechanism by using another biasing spring. When using a biasing spring, the rest position of the locking tab holder 31 would be shown in FIG. 4. Then, only positive clockwise rotation of the handle 25 would move the locking tab 29 out of the workpiece travel path. Once the handle 25 is released, the spring bias would rotate the locking tab holder 31 back into the travel path of the workpiece 36.

A similar operation exists for the lower bed of rollers when receiving or discharging a workpiece However, the handle 25 associated with the lower bed of rollers carrier assembly is linked to the rod using a connecting linkage assembly 39, see FIG. 1. The linkage assembly 39 is attached at one end to the handle 25 and at the other end 41 to the rod 27 so that clockwise rotation of the handle 25 associated with the lower bed of rollers rotates the rod 27 about its axis to pivot the locking tab holder out of the travel path of the workpiece.

It should be understood that other configurations can be utilized providing that the locking tab is biased in its locked position and moved or pivoted out of the way of a workpiece being slid onto the bed of rollers. Similarly, other mechanisms can be utilized to pivot the locking tab and locking tab holder out of the way of the travel of a workpiece for discharging it from the bed of rollers. Alternative handle configurations could also be utilized so long as some operative connection is provided between the locking tab and its holder and a handle device.

The inventive guide 11 of the cart 10 assists in moving a workpiece on or off the beds of rollers 15 and 16. The guide 11 includes a nylon strip 39 mounted to frame supports 41. A cross member 43 is also provided having rubber stops 45 mounted thereon to stop the travel of a workpiece once the bed of rollers. Of course, other stop configurations can be used to prevent the workpiece from sliding off the bed of rollers.

The cart 10 includes a foot brake assembly 51 which locks the cart in place by depression of the foot brake pedal 53. Pedal 53 depression causes the stop 55 to frictionally engage a surface upon which the cart travels to lock the cart in place. The foot brake assembly 51 provides a safety procedure to prevent movement of the cart when loading or unloading a workpiece.

The cart 10 also includes centering guides 57 associated with each bed of rollers 15 and 16. The centering guides preferably include a v-slot 59 which can interface with a burn-in board oven or burn-in board inserter for easy docking of the cart 10.

Although a pair of carrier assemblies 9 are shown for the cart 10, one or more than two carrier assemblies can be used depending on the type of workpiece being transported and the type of apparatus that the cart must interface with.

Preferably, the frame 1 is made from an aluminum tubular construction, either round or square in cross-section for high strength and light weight. However, other materials and configurations can be used.

Again, although the inventive cart is especially adapted for burn-in board transport due to the burn-in board's heavy weight, the cart can be used for any type of workpiece for transportation thereof.

As such, an invention has been disclosed in terms of preferred embodiments thereof which fulfill each and every one of the objects of the present invention as set forth herein above and provides an improved carrier cart for transport of workpieces.

Of course, various modifications, changes and alterations from the teachings of the present invention can be utilized as would be recognized by one of ordinary skill in the art. The invention is to be limited only by the terms of the appended claims.

We claim:

1. A cart for transporting a workpiece comprising:
   a) a frame having a wheeled base;
   b) at least one carrier assembly supported by said frame, the carrier assembly including a bed of rollers for receiving, supporting and discharging the workpiece;
   c) a locking mechanism supported by said frame having a locking tab and a stop positioned in a travel path of said workpiece above said bed of rollers, said locking tab moveable about a first axis out of said travel path for receiving said workpiece onto said bed of a rollers and biased for movement about said first axis into said travel path for locking said workpiece between the stop and the locking tab, and said locking tab moveable about a second axis, different than said first axis, out of said travel path for discharging said workpiece from said bed of rollers.

2. The cart of claim 1 wherein said frame also supports an entry/exit roller aligned with the bed of rollers for said receiving and discharging of the workpiece.

3. The cart of claim 1 wherein said frame includes a guide positioned above the bed of rollers for guiding the workpiece during the receiving and discharging.

4. The cart of claim 1 wherein said stop further comprises a cross-member on said frame positioned above said bed of rollers with rubber stops mounted on the cross member.

5. The cart of claim 1 wherein said frame includes a push bar.

6. The cart of claim 1 wherein said frame includes a centering tab aligned below said bed of rollers, the centering tab sized to align the cart with a workpiece treating apparatus.

7. The cart of claim 1 comprising a pair of beds of rollers for receiving, supporting and discharging a pair of workpiece and a locking mechanism for each bed of rollers.

8. The cart of claim 7 wherein said locking mechanism further comprises a rod rotatably supported by said frame and positioned adjacent the bed of rollers, one end of the rod operatively connected to a handle, the rod also supporting a locking tab holder which provides a pivotal mount for said locking tab for pivotal movement about said first axis, rotative movement of said rod moving said locking tab about said second axis.

9. The cart of claim 8 wherein said locking tab is mounted to said locking tab holder with a spring bias to bias said locking tab for movement in a first direction for said locking of said workpiece, said locking tab moveable in a second direction opposite said first direction to permit entry of said workpiece onto said bed of rollers.

10. The cart of claim 9 wherein said pair of beds of rollers are attached to said frame as upper and lower roller beds and the handle of the locking mechanism for the lower roller bed is linked to said rod by a connector to permit said rotative movement of said rod of said lower bed of rollers.

11. The cart of claim 1 wherein said locking mechanism further comprises a rod rotatably supported by said frame and positioned adjacent the bed of rollers, one end of the rod operatively connected to a handle, the rod also supporting a locking tab holder which provides a pivotal mount for said locking tab for pivotal movement about said first axis, rotative movement of said rod moving said locking-tab about said second axis.

12. The cart of claim 11 wherein said locking tab is mounted to said locking tab holder with a spring bias to bias said locking tab for movement in a first direction for said locking of said workpiece, said locking tab moveable in a second direction opposite said first direction to permit entry of said workpiece onto said bed of rollers.

13. The cart of claim 1 further comprising a brake assembly to lock the cart in place.

14. The cart of claim 1 wherein the at least one carrier assembly is sized for receiving, supporting and discharging a burn-in board.

15. A cart for transporting at least one burn-in board comprising:
   a) a frame having a wheeled base;
   b) a pair of carrier assemblies, each carrier assembly supported by said frame in upper and lower positions, respectively, and having a bed of rollers for receiving, supporting and discharging a burn-in board the bed of rollers sized to receive said burn-in board;
   c) a locking mechanism for each carrier assembly, each locking mechanism including a locking tab and a stop positioned in a travel path of said burn-in board, said locking tab moveable about a first axis out of said travel path for receiving a burn-in board onto the bed of rollers and biased for movement about said first axis into said travel path for locking the burn-in board in place on the bed of rollers, said locking tab moveable about a second axis, different than said first axis, out of said travel path for discharging the burn-in board from the bed of rollers.

16. The cart of claim 15 further comprising:
   i) an entry exit roller mounted to the frame for each carrier assembly;
   ii) a guide positioned on said frame and above each carrier assembly for guiding said burn-in board during receiving and discharging;

iii) a push bar attached to said frame; and iv) a centering tab attached to said frame for each carrier assembly to align the cart with a burn-in board treating apparatus.

17. The cart of claim 15 further comprising a brake assembly to lock the cart in place.

18. The cart of claim 15 wherein said locking mechanism further comprises a rod rotatably supported by said frame and positioned adjacent the bed of rollers, one end of the rod operatively connected to a handle, the rod also supporting a locking tab holder which provides a pivotal amount for said locking tab about said first axis, rotative movement of said rod moving said locking tab about said second axis.

19. The cart of claim 18 wherein said locking tab is mounted to said locking tab holder with a spring bias to bias said locking tab for movement in a first direction for said locking of said burn-in board, said locking tab moveable in a second direction opposite said first direction to permit entry of said burn-in board onto said bed of rollers.

20. The cart of claim 18 wherein said pair of beds of rollers are attached to said frame as upper and lower roller beds, respectively, and the handle of the locking mechanism for the lower bed of rollers is linked to said rod by a connector to permit said rotative movement of said rod for said lower bed of rollers.

* * * * *